US005403764A

United States Patent [19]

Yamamoto et al.

[11] Patent Number: 5,403,764

[45] Date of Patent: Apr. 4, 1995

[54] METHOD FOR PRODUCING A ROM ON A SEMICONDUCTOR DEVICE HAVING A NONVOLATILE MEMORY

[75] Inventors: Hiroki Yamamoto; Hiroshi Oji, both of Kyoto, Japan

[73] Assignee: Rohm Co., Ltd., Kyoto, Japan

[21] Appl. No.: 37,439

[22] Filed: Mar. 26, 1993

[30] Foreign Application Priority Data

Apr. 28, 1992 [JP] Japan ........ 4-110050

[51] Int. Cl.[6] ........ A01L 21/265

[52] U.S. Cl. ........ 437/48; 437/43; 437/45; 365/178

[58] Field of Search ........ 437/52, 47, 60, 43, 437/45, 48; 257/390-391, 314, 315-316

[56] References Cited

U.S. PATENT DOCUMENTS 4,230,504 10/1980 Kuo ........ 437/45
4,268,950 5/1981 Chatterjee et al. ........ 437/45
4,367,580 1/1983 Guterman ........ 257/316
4,471,373 9/1984 Shimizu et al. ........ 257/315
4,500,899 2/1985 Shirai et al. ........ 257/391
4,513,494 4/1985 Batra ........ 257/391
5,094,971 3/1992 Kanebako ........ 437/45
5,229,631 7/1993 Woo ........ 257/314

*Primary Examiner*—Olik Chaudhuri
*Assistant Examiner*—H. Jey Tsai
*Attorney, Agent, or Firm*—Nikaido, Marmelstein, Murray & Oram

[57] ABSTRACT

In a method for producing a semiconductor device having a nonvolatile memory capable of electrically writing, reading and erasing, and a read only memory; the improvement wherein the method includes a step of writing a state of "0" or "1" in the read only memory by doping said read only memory with an impurity for adjusting a threshold voltage of the read only memory, and steps for producing the read only memory other than the step of writing are the same as steps for producing the nonvolatile memory.

1 Claim, 3 Drawing Sheets

METHOD FOR PRODUCING A ROM ON A SEMICONDUCTOR DEVICE HAVING A NONVOLATILE MEMORY

FIELD OF THE INVENTION

The present invention relates to a method for producing a semiconductor device, and more particularly, to such a method capable of incorporating a read only memory into a semiconductor device having a nonvolatile memory (flash memory).

BACKGROUND OF THE INVENTION

A floating gate-type flash memory device has heretofore been used as a nonvolatile memory allowing electrical writing, reading and erasing. A flash memory of this type has a three-layered structure of polysilicon-insulator-polysilicon wherein a floating gate and a control gate are formed of polysilicon films, respectively and an interlayer insulating film, for example, made of silicon oxide or silicon nitride is sandwiched by the polysilicon films.

FIG. 5 shows the structure of such a flash memory. In FIG. 5, a semiconductor substrate 1 is covered with a silicon oxide film 4 functioning as a gate insulating film on which sequentially a floating gate 5 formed of a polysilicon film, an interlayer insulating film 6 formed of a silicon oxide film and a control gate 7 formed of a polysilicon film are stacked. Further, n-type impurity diffusion formed regions are in the p-type silicon substrate 1 on opposite sides of the gate electrode to form a source region 2 and a drain region 3. On the substrate surface, a LOCOS film 8 for device isolation, and a $n^{--}$-type lightly doped region 9 underlies the source region 2 for enhancing the dielectric strength of the memory device is formed.

When the flash memory thus arranged is to be written with data, voltage is applied to a region interposed between the drain region 3 and the control gate 7 to inject electrons into the floating gate 5, and the amount of electrons to be injected is controlled to vary depending on which data component "1" or "0" is to be stored. The stored data can be erased by applying voltage inversely, or across the control gate and the source region 2 to drain the injected hot electrons. Then, the flash memory becomes ready to be rewritten.

Conventionally, a rewritable and erasable flash memory of this type is frequently made to coexist in a semiconductor device with a read only memory (ROM) which is not adapted for erasing of data once stored therein. In order to simplify the production process for such a semiconductor device, however, the semiconductor device is produced with all the memory therein composed of a rewritable and erasable flash memory device even if a ROM is needed therein, and then some of the flash memory devices are electrically written for use as a ROM.

As described the above, the ROM is produced by the same process as the flash memory and have the same structure as the flash memory. For this reason, the ROM cannot be used as a ROM without writing a state of "1" or "0". Then, the ROM without reading "0" or "1", cannot be used as a memory. Accordingly, there is such a problem that the memory for use as a ROM needs to be written upon use.

SUMMARY OF THE INVENTION

In view of the above-mentioned problem, it is an object of the present invention to provide a method for producing a semiconductor device wherein ROM is incorporated into a semiconductor device having flash memory by performing a writing operation during the production process.

According to the present invention, there is provided a method for producing a semiconductor device having a nonvolatile memory capable of electrically writing, reading and erasing, and a read only memory; the improvement wherein the method includes a step of writing a state of "0" or "1" in the read only memory by doping said read only memory with an impurity for adjusting a threshold voltage of the read only memory, and steps for producing the read only memory other than the step of writing are the same as steps for producing the nonvolatile memory.

In the present invention two ion implantation steps are added to a typical production process for a flash memory prior to formation of a gate electrode thereof so as to make the impurity concentration of channel regions of predetermined read only memory devices different from each other, whereby the threshold voltages of the respective read only memory devices are made different from each other to store data components "1" and "0" therein, respectively. Therefore, it becomes unnecessary to perform a writing operation after the intended semiconductor device is completed.

Further, a rewritable flash memory part can be fabricated by the typical production process therefor. Accordingly, a semiconductor device can readily be obtained in which incorporated are both a flash memory and a read only memory having been written with data.

DETAILED DESCRIPTION

Now, the present invention will be described in detail with reference to the drawings which illustrate how to store a state of "1" and "0" in a ROM part of a semiconductor device incorporating a flash memory part and the ROM part.

Figure 1:
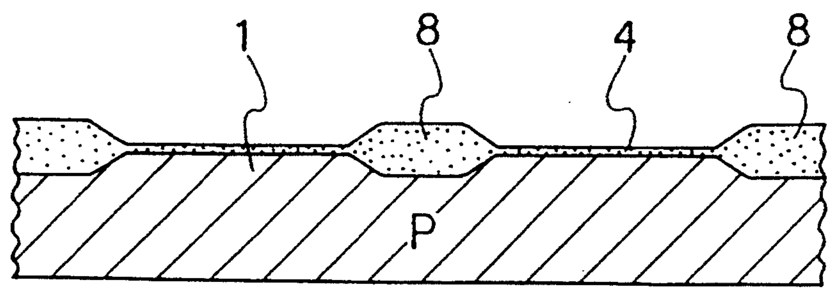
FIGS. 1 to 3 are each a schematic section showing a ROM part in two different storage states for illustrating a step of a production process for a semiconductor device according to the present invention.

Referring to FIG. 1, firstly a LOCOS film 8 is formed on the surface of a semiconductor substrate 1 for device isolation by, for example, thermal oxidation. Practically, a p-type substrate 1 was subjected to thermal oxidation at about 1100° C. for about 90 minutes with masking regions other than a LOGOS formation region with a well-known oxidation-protective film, for example, made of a film nitride.

Figure 2:
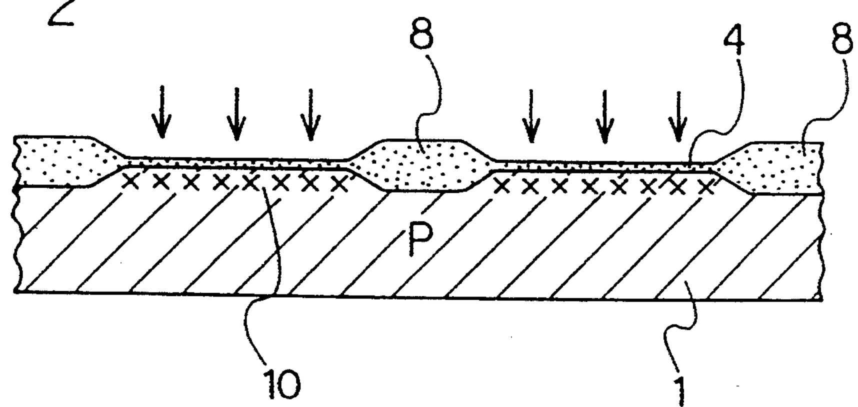

Referring to FIG. 2, a state of "1" is stored by doping a predetermined ROM formation region with an impurity to adjust the threshold voltage thereof to a first value. Practically, a p-type impurity such as boron was implanted into the whole surface of the semiconductor substrate 1 through a thin silicon oxide film 4 to form a first $p^+$-type impurity-doped region 10 which is used for controlling a first threshold voltage. In this case, boron ion was implanted at an acceleration energy of 40 to 50 keV and in a dose of 1E12 to 3E12 atoms $cm^{-2}$ to form the first impurity-doped region 10, the impurity concentration of which was $10^{16}$ to $10^{-17}$ $cm^{-3}$ and the threshold voltage was adjusted to 1 V.

Figure 3:
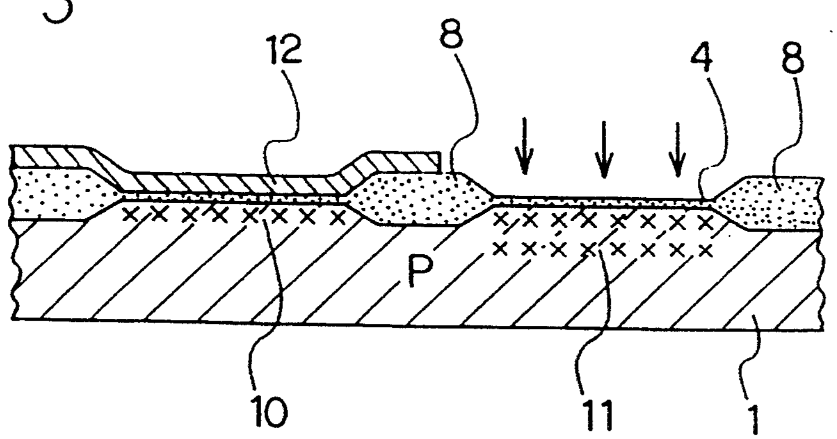

Referring to FIG. 3, subsequently a state of "0" is stored in part of the ROM formation region by doping that part with an impurity with other parts masked, so as to control a second threshold voltage thereof to value. Practically, a left-hand side cell portion which was intended to store a state of "1" was covered with a resist film 12, then boron ion was implanted again into a right-hand side cell portion. In this case, the boron implantation was carried out at an acceleration energy of 40 to 50 keV and in a dose of 5E12 to 1E13 atoms $cm^{-2}$ to form a second impurity-doped region 11, the impurity concentration of which was increased to about $10^{17}$ to $10^{18}$ $cm^{-3}$ and the threshold voltage was adjusted to about 7 V. Thus, a state of "0" was stored in the right-hand cell portion. By virtue of the above two inplantations, the state of "1" and the state of "0" could be stored in the respective cell portions.

Figure 4:
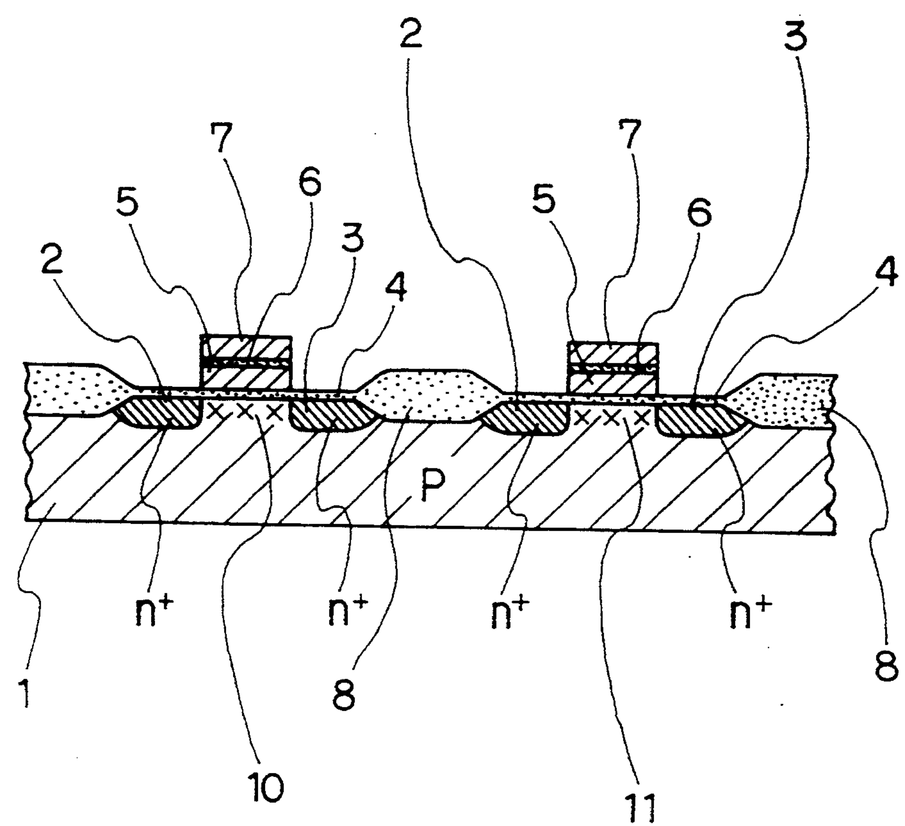
FIG. 4 is a schematic section showing the ROM part in two different storage states for illustrating the final step of the production process for the semiconductor device according to the present invention.
Figure 5:
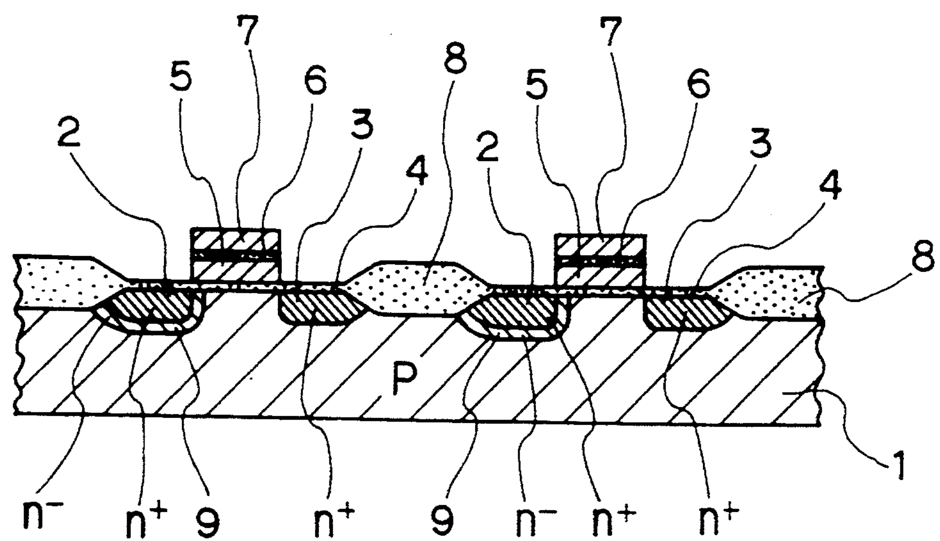
FIG. 5 is a schematic section showing a conventional flash memory.

Referring to FIG. 4, thereafter, a first polysilicon film 5, an interlayer insulating film 6 and a second polysilicon film 7 are sequentially stacked, then patterned to form a gate electrode. This step is completely the same as that for forming a flash memory coexisting in the intended semiconductor device. Thus, the ROM part and the flash memory part are formed at a time in the same manner. Although a gate electrode of a ROM is usually composed of one layer and does not necessarily have a three-layered structure as above, the ROM in this example is formed together with the flash memory in the single production process so as to attain the object of the present invention, or minimizing the steps needed for forming a ROM. Therefore, the first polysilicon film 5 of the ROM is equivalent to a floating gate of the flash memory, while the second polysilicon film 7 of the ROM is equivalent to a control gate of the flash memory device. In this arrangement, the first polysilicon film 5 of the ROM device is not injected with electrons. When a voltage for reading is applied to the second polysilicon film 7 of the ROM device, electrons are induced at the first polysilicon film 5 so as to act on the channel region through the gate insulating film 4, whereby the written state of "1" or "0" can be read out. Thus, the ROM in this embodiment operates without any disadvantage.

Thereafter, an impurity which is different from the above impurity in conductive type is implanted into source/drain formation regions present on opposite sides of the gate electrode to form a source region 2 and a drain region 3.

Practically, as shown in FIG. 4, a first polysilicon film 5, interlayer insulating film 6, for example, made of silicon oxide or silicon nitride and a second polysilicon film 7 were sequentially formed as having thicknesses of 0.2 $\mu m$, 0.03 $\mu m$ and 0.4 $\mu m$, respectively, by a known technique such as CVP, so as to form a gate electrode on each of the channel regions (threshold adjusted regions) 10 and 11 by patterning. Further, phosphorus ion was implanted into predetermined substrate regions on opposite sides of the gate electrode to form $n^+$-type source and drain regions 2 and 3. Thus, the ROM was completed.

The source and drain regions 2 and 3 are also formed in the flash memory in completely the same manner. In addition, all the production steps including formation of an electrode film except the above-mentioned two threshold adjustment inplantations are identical to the production process for the flash memory. Accordingly, a semiconductor device incorporating a ROM having been written with data as well as a flash memory can be obtained if only two steps for threshold adjustment are added to a conventional production process for a semiconductor device having a flash memory.

It should be understood that although doping with an impurity is achieved by ion implantation in the above example, the present invention is not limited to ion implantation, and the doping can be achieved by, for example, a diffusion method or a like method.

According to the present invention, in a production process for a semiconductor device incorporating flash memory and ROM addition of only a few steps can give a ROM having been written with data. Thus, data can be immediately read out without writing upon use of the semiconductor device, resulting in convenience for use.

Further, since the ROM part of the semiconductor device does not need writing upon use, there is no need to make the gate insulating film thin. Specifically, the thickness of the gate insulating film of the ROM according to the present invention can be in the range of 200 to 300Å, while it is conventionally limited to the range of 100±10Å. Accordingly, the gate insulating film of the ROM can be formed at the same time with that of a peripheral transistor, facilitating production operations and improving the reliability of the resulting device.

Furthermore, since the data written in the ROM part cannot be erased, a high voltage is not applied to the source region. Accordingly, there is no need to form a lightly doped region in the source region for mitigating a high voltage, resulting in simplification of the production process.

Though several embodiments of the present invention are described above, it is to be understood that the present invention is not limited only to the above-mentioned and various changes and modifications may be made in the invention without departing from the spirit and scope thereof.

What is claimed is:

1. A method for producing a semiconductor device having a flash memory and a read only memory comprising steps of:

(a) forming a thin insulating film on a surface of a substrate;

(b) forming a field insulating film for isolating each memory cell;

(c) doping a region where a read only memory cell is to be formed with an impurity for controlling a threshold voltage in a first state of storing;

(d) doping said region where said read only memory call is to be formed in a second state, with an impurity for controlling a threshold voltage in a second state of storing, after masking part of said region where said read only memory cell in a first state of storing;

(e) forming a first polysilicon film, an interlayer insulating film and a second polysilicon film in order on a surface of the semiconductor substrate and forming a gate electrode by patterning; and (f) forming a source region and a drain region by doping regions on opposite sides of the gate electrode with an impurity in such a manner that the gate electrode is used as a mask.

* * * * *